(12) United States Patent
Saraf et al.

(10) Patent No.: US 10,179,946 B2
(45) Date of Patent: Jan. 15, 2019

(54) COATED ARTICLE HAVING LOW-E COATING WITH IR REFLECTING LAYER(S) AND NIOBIUM BISMUTH BASED HIGH INDEX LAYER AND METHOD OF MAKING SAME

(71) Applicant: Guardian Industries Corp., Auburn Hills, MI (US)

(72) Inventors: Gaurav Saraf, San Jose, CA (US); Scott Jewhurst, San Jose, CA (US); Guowen Ding, San Jose, CA (US); Daniel Schweigert, San Jose, CA (US); Minh Le, San Jose, CA (US); Guizhen Zhang, San Jose, CA (US); Daniel Lee, San Jose, CA (US); Cesar Clavero, San Jose, CA (US); Marcus Frank, Gelnhausen (DE); Brent Boyce, Novi, MI (US)

(73) Assignee: Guardian Glass, LLC, Auburn Hills, MI (US)

( * ) Notice: Subject to any disclaimer, the term of this patent is extended or adjusted under 35 U.S.C. 154(b) by 35 days.

(21) Appl. No.: 15/448,620

(22) Filed: Mar. 3, 2017

(65) Prior Publication Data
US 2018/0251890 A1    Sep. 6, 2018

(51) Int. Cl.
| *B32B 15/04* | (2006.01) |
| *B32B 17/06* | (2006.01) |
| *C23C 14/34* | (2006.01) |
| *C23C 14/18* | (2006.01) |
(Continued)

(52) U.S. Cl.
CPC ...... *C23C 14/3464* (2013.01); *C23C 14/0652* (2013.01); *C23C 14/083* (2013.01); *C23C 14/086* (2013.01); *C23C 14/185* (2013.01)

(58) Field of Classification Search
USPC .................. 428/426, 428, 432, 434, 688
See application file for complete search history.

(56) References Cited

U.S. PATENT DOCUMENTS

| 4,883,721 A | 11/1989 | Nalepka et al. |
| 5,344,718 A | 9/1994 | Hartig et al. |
(Continued)

FOREIGN PATENT DOCUMENTS

| EP | 2 746 236 | 6/2014 |
| WO | WO 03/020656 | 3/2003 |
(Continued)

OTHER PUBLICATIONS

U.S. Appl. No. 15/448,629, filed Mar. 3, 2017; Ding et al.
U.S. Appl. No. 15/448,739, filed Mar. 3, 2017; Zhang et al.

*Primary Examiner* — Lauren R Colgan
(74) *Attorney, Agent, or Firm* — Nixon & Vanderhye P.C.

(57) ABSTRACT

A coated article includes a low emissivity (low-E) coating on a glass substrate. The low-E coating includes at least one infrared (IR) reflecting layer of a material such as silver, gold, or the like, and at least one high refractive index layer of or including NbBi. The high index layer (e.g., $NBBiO_x$) is designed and deposited so as to be amorphous in the low-E coating, so as to better withstand optional heat treatment (HT) such as thermal tempering. The high index layer may be a transparent dielectric high index layer.

25 Claims, 1 Drawing Sheet

(51) Int. Cl.
*C23C 14/08* (2006.01)
*C23C 14/06* (2006.01)

(56) References Cited

U.S. PATENT DOCUMENTS

| | | | |
|---|---|---|---|
| 6,210,784 B1 * | 4/2001 | Rondeau | C03C 17/36 |
| | | | 359/580 |
| 6,524,647 B1 * | 2/2003 | Varanasi, Sr. | C03C 17/2453 |
| | | | 427/166 |
| 6,541,133 B1 * | 4/2003 | Schicht | C03C 17/2453 |
| | | | 428/697 |
| 6,576,349 B2 | 6/2003 | Lingle et al. | |
| 6,602,608 B2 | 8/2003 | Stachowiak | |
| 6,610,410 B2 | 8/2003 | Ebisawa et al. | |
| 6,797,389 B1 * | 9/2004 | Depauw | B32B 17/10036 |
| | | | 427/163.1 |
| 7,005,188 B2 | 2/2006 | Anderson et al. | |
| 7,138,182 B2 * | 11/2006 | Krisko | C03C 17/36 |
| | | | 428/433 |
| 7,153,579 B2 | 12/2006 | Kriltz et al. | |
| 7,241,506 B2 | 7/2007 | Hartig | |
| 7,267,879 B2 * | 9/2007 | Thomsen | C03C 17/36 |
| | | | 428/428 |
| 7,390,572 B2 | 6/2008 | Butz et al. | |
| 8,940,400 B1 * | 1/2015 | Wuillaume | C03C 17/36 |
| | | | 428/434 |
| 8,945,714 B2 | 2/2015 | Lao et al. | |
| 9,028,956 B2 | 5/2015 | Knoll et al. | |
| 9,028,983 B2 | 5/2015 | Imran et al. | |
| 9,052,456 B2 | 6/2015 | Hassan et al. | |
| 9,199,874 B2 | 12/2015 | Peter et al. | |
| 9,212,417 B2 | 12/2015 | Frank et al. | |
| 9,297,197 B2 | 3/2016 | Lao et al. | |
| 9,315,414 B2 * | 4/2016 | Hassan | C03C 17/366 |
| 9,365,450 B2 | 6/2016 | Ding et al. | |
| 9,371,684 B2 | 6/2016 | Butz et al. | |
| 9,403,345 B2 | 8/2016 | Lao et al. | |
| 9,410,359 B2 | 8/2016 | Ding et al. | |
| 9,416,049 B2 * | 8/2016 | Ju | C03C 17/3417 |
| 9,494,717 B2 | 11/2016 | Reymond et al. | |
| 9,518,319 B2 * | 12/2016 | Ding | G02F 1/091 |
| 9,556,070 B2 | 1/2017 | Wuillaume et al. | |
| 2003/0012963 A1 * | 1/2003 | Ebisawa | C03C 17/36 |
| | | | 428/432 |
| 2009/0169846 A1 * | 7/2009 | Siddle | C03C 17/36 |
| | | | 428/216 |
| 2013/0164561 A1 * | 6/2013 | Hassan | C03C 17/36 |
| | | | 428/702 |
| 2014/0022630 A1 * | 1/2014 | Reymond | C03C 17/36 |
| | | | 359/360 |
| 2014/0186598 A1 * | 7/2014 | Ding | C03C 17/36 |
| | | | 428/216 |
| 2014/0319687 A1 * | 10/2014 | Billet | H01L 51/0017 |
| | | | 257/751 |
| 2015/0232378 A1 * | 8/2015 | Hassan | C03C 17/366 |
| | | | 427/165 |
| 2016/0298384 A1 * | 10/2016 | You | C09D 5/00 |

FOREIGN PATENT DOCUMENTS

| | | |
|---|---|---|
| WO | WO 03/055816 | 7/2003 |
| WO | WO 2011/003974 | 1/2011 |
| WO | WO 2012/127162 | 9/2012 |
| WO | WO 2015/034798 | 3/2015 |
| WO | WO 2016/062691 | 4/2016 |

* cited by examiner

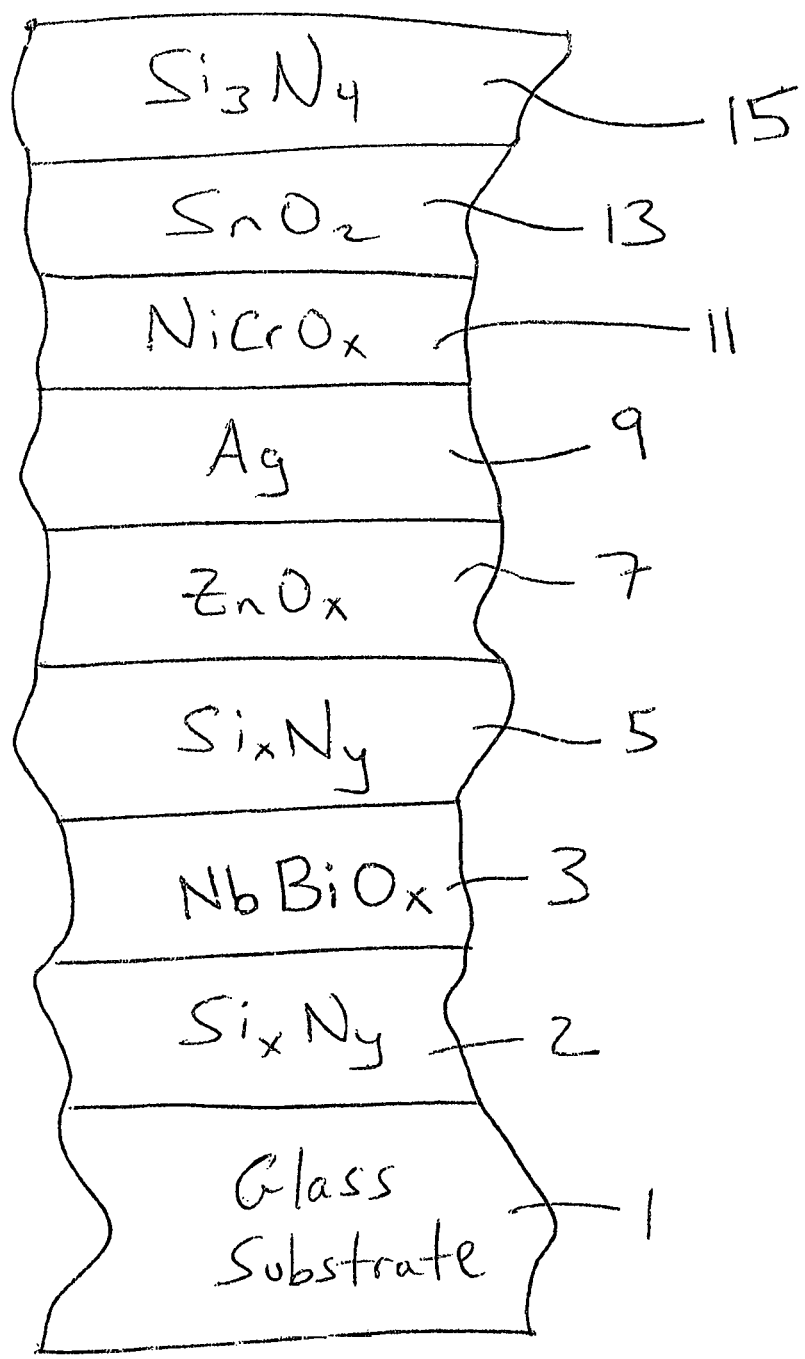

US 10,179,946 B2

COATED ARTICLE HAVING LOW-E COATING WITH IR REFLECTING LAYER(S) AND NIOBIUM BISMUTH BASED HIGH INDEX LAYER AND METHOD OF MAKING SAME

This application relates to a coated article including a low emissivity (low-E) coating having at least one infrared (IR) reflecting layer of a material such as silver, gold, or the like, and at least one high refractive index layer of or including NbBi. The high index layer (e.g., NbBiO$_x$) is designed and deposited so as to be amorphous in the low-E coating, so as to better withstand optional heat treatment (HT) such as thermal tempering. The high index layer may be a transparent dielectric high index layer in preferred embodiments, which is provided for antireflection purposes and/or color adjustment purposes, in addition to having thermal stability. In certain example embodiments, the low-E coating may be used in applications such as monolithic or insulating glass (IG) window unit, vehicle windows, of the like.

BACKGROUND AND SUMMARY OF EXAMPLE EMBODIMENTS OF THE INVENTION

Coated articles are known in the art for use in window applications such as insulating glass (IG) window units, vehicle windows, monolithic windows, and/or the like.

Conventional low-E coatings are disclosed, for example and without limitation, in U.S. Pat. Nos. 6,576,349, 9,212,417, 9,297,197, 7,390,572, 7,153,579, and 9,403,345, the disclosures of which are hereby incorporated herein by reference.

Certain low-E coating utilize at least one transparent dielectric layer of titanium oxide (e.g., TiO$_2$), which has a high refractive index (n), for antireflection and/or coloration purposes. See for example U.S. Pat. Nos. 9,212,417, 9,297,197, 7,390,572, 7,153,579, and 9,403,345. Although high refractive index dielectric materials such as TiO$_2$ are known and used in low-E coatings, these materials are typically not heat stable after tempering process of about 650 C for 8 minutes, due to film crystallization (or change in crystallinity) in as-deposited or post-tempering state, which may in turn induce thermal or lattice stress on adjacent layers in the film stack. Such stress can further cause change in physical or material properties of the stack and hence impact on the Ag layer, which results in deteriorated low E stack performance.

Example embodiments of this invention solve these problems by providing a high index layer for use in low-E coatings that both has a high refractive index (n) and is substantially stable upon heat treatment (HT).

"Heat treatment" (HT) and like terms such as "heat treating" and "heat treated", such as thermal tempering, heat strengthening, and/or heat bending, as used herein means heat treating the glass substrate and coating thereon at temperature of at least 580 degrees C. for at least 5 minutes. An example heat treatment is heat treating at temperature of about 600-650 degrees C. for at least 8 minutes.

In example embodiments of this invention, a high index layer for use in low-E coatings is provided that both has a high refractive index (n) and is substantially stable upon heat treatment (HT). A coated article includes a low emissivity (low-E) coating having at least one infrared (IR) reflecting layer of a material such as silver, gold, or the like, and at least one high refractive index layer of or including NbBi. The high index layer (e.g., NbBiO$_x$) is designed and deposited so as to be amorphous in the low-E coating, so as to better withstand optional heat treatment (HT) such as thermal tempering. The high index layer may be a transparent dielectric high index layer in preferred embodiments, which is provided for antireflection purposes and/or color adjustment purposes, in addition to having thermal stability. In certain example embodiments, the low-E coating may be used in applications such as monolithic or insulating glass (IG) window unit, vehicle windows, of the like.

In an example embodiment of this invention, there is provided a coated article including a coating supported by a glass substrate, the coating comprising: a first transparent dielectric layer on the glass substrate; an infrared (IR) reflecting layer comprising silver on the glass substrate, located over at least the first transparent dielectric layer; a second transparent dielectric layer on the glass substrate, located over at least the IR reflecting layer; and wherein at least one of the first and second transparent dielectric layers is amorphous and comprises an oxide of Nb and Bi.

In an example embodiment of this invention, there is provided a method of making a coated article including a coating supported by a glass substrate, the method comprising: sputter depositing a first transparent dielectric layer on the glass substrate; sputter-depositing an infrared (IR) reflecting layer comprising silver on the glass substrate, located over at least the first transparent dielectric layer; sputter-depositing a second transparent dielectric layer on the glass substrate, located over at least the IR reflecting layer; and wherein at least one of the first and second transparent dielectric layers is sputter-deposited so as to be amorphous or substantially amorphous, and comprise an oxide of Nb and Bi.

In an example embodiment of this invention, there is provided a method of making a coated article including a layer supported by a glass substrate, the method comprising: having a glass substrate; sputter-depositing an amorphous, or substantially amorphous, layer comprising an oxide of Nb and Bi on (directly or indirectly) the glass substrate. The layer may be sputter-deposited in an oxygen depleted atmosphere (an atmosphere including less oxygen gas than needed to form a fully stoichiometric oxide layer) so that a difference in cationic radii for Nb and Bi causes lattice disorder leading to amorphous or substantially amorphous structure of the layer.

BRIEF DESCRIPTION OF THE DRAWINGS

FIG. 1 is a cross sectional view of a coated article according to an example embodiment of this invention.

DETAILED DESCRIPTION OF EXAMPLE EMBODIMENTS OF THE INVENTION

Referring now to the drawings in which like reference numerals indicate like parts throughout the several views.

Coated articles herein may be used in applications such as monolithic windows, IG window units such as residential windows, patio doors, vehicle windows, and/or any other suitable application that includes single or multiple substrates such as glass substrates.

High refractive index material such as TiO$_2$ with low or no light absorption in the visible range is often used in low-E coatings in window applications. However, TiO$_2$ is typically not heat stable after a thermal tempering process such as involving HT at about 650 C for 8 minutes, due to film crystallization (or change in crystallinity) in as-deposited or post-tempering state, which may in turn induce thermal or lattice stress on adjacent layers in the film stack. Such a stress can further cause change in physical or material properties of the stack and hence impact on the IR reflecting Ag based layer, which results in deteriorated low E stack performance.

Example embodiments of this invention provide for a high index layer(s) designed to suppress crystallinity in the high index low absorption layers, irrespective of HT conditions such as thermal tempering. A high index layer 3 for use in low-E coatings is provided that both has a high refractive index (n) and is substantially stable upon heat treatment (HT). A coated article includes a low emissivity (low-E) coating having at least one infrared (IR) reflecting layer 9 of a material such as silver, gold, or the like, and at least one high refractive index layer 3 of or including NbBi. The high index layer (e.g., $NbBiO_x$) 3 is designed and deposited so as to be amorphous or substantially amorphous (as opposed to crystalline) in the low-E coating, so as to better withstand optional heat treatment (HT) such as thermal tempering. "Substantially amorphous" as used herein means majority amorphous, and more amorphous than crystalline. For instance, "substantially amorphous" includes at least 60% amorphous, at least 80% amorphous, at least 90% amorphous, and fully amorphous. The high index layer 3 may be a transparent dielectric high index layer, and may be oxided and/or nitrided, in preferred embodiments, and is provided for antireflection purposes and/or color adjustment purposes, in addition to having thermal stability.

FIG. 1 is a cross sectional view of a coated article according to an example embodiment of this invention. The coated article includes glass substrate 1 (e.g., clear, green, bronze, or blue-green glass substrate from about 1.0 to 10.0 mm thick, more preferably from about 1.0 mm to 6.0 mm thick), and a multi-layer coating (or layer system) provided on the substrate 1 either directly or indirectly. As shown in FIG. 1, the example low-E coating 25 is of or includes optional transparent dielectric layer 2 of or including silicon nitride (e.g., $Si_3N_4$, or some other suitable stoichiometry), high index amorphous or substantially amorphous transparent dielectric layer 3 based on Nb and Bi which may be oxided and/or nitrided, transparent dielectric layer 5 of or including silicon nitride (e.g., $Si_3N_4$, or some other suitable stoichiometry), zinc oxide inclusive contact layer 7 (e.g., $ZnO_x$ where "x" may be about 1; or $ZnAlO_x$), IR (infrared) reflecting layer 9 including or of silver, gold, or the like, upper contact layer 11 of or including an oxide of Ni and/or Cr (e.g., $NiCrO_x$), and an overcoat of or including tin oxide inclusive dielectric layer 13 and silicon nitride inclusive dielectric layer 15. The silicon nitride inclusive layers 2, 5, and/or 15 may further include Al, oxygen, or the like, and the tin oxide layer 13 may likewise further include or be of other materials such as nitrogen, zinc, zinc oxide, or the like. Other layers and/or materials may also be provided in the coating in certain example embodiments of this invention, and it is also possible that certain layers may be removed or split in certain example instances. Moreover, one or more of the layers discussed above may be doped with other materials in certain example embodiments of this invention. This invention is not limited to the layer stack shown in FIG. 1, as the FIG. 1 stack is provided for purposes of example only in order to illustrate an example location for a high index layer 3.

In monolithic instances, the coated article includes only one substrate such as glass substrate 1 (see FIG. 1). However, monolithic coated articles herein may be used in devices such as IG window units for example. Typically, an IG window unit may include two or more spaced apart substrates with an air gap defined therebetween. Example IG window units are illustrated and described, for example, in U.S. Pat. Nos. 5,770,321, 5,800,933, 6,524,714, 6,541,084 and US 2003/0150711, the disclosures of which are all hereby incorporated herein by reference. For example, the coated glass substrate shown in FIG. 1 may be coupled to another glass substrate via spacer(s), sealant(s) or the like with a gap being defined therebetween in an IG window unit. In certain example instances, the coating may be provided on the side of the glass substrate 1 facing the gap, i.e., surface #2 or surface #3. In other example embodiments, the IG window unit may include additional glass sheets (e.g., the IG unit may include three spaced apart glass sheets instead of two).

High index transparent dielectric layer 3 preferably has a refractive index (n, measured at 550 nm) of at least 2.2, more preferably of at least 2.25. In example embodiments of this invention the high index low absorption layer 3 is designed by alloying high index $NbO_x$ (n at 550 nm of about 2.2-2.4, k at 400 nm of about 0.001-0.005, Eg~3.4 eV) and $BiO_x$ (n at 550 nm of about 2.5-2.6, k at 400 nm of about 0.01-0.05, Eg~2.9 eV) in an appropriate composition range to produce a high index ternary alloy $NbBiO_x$, which may optionally include some nitrogen such as no greater than 15%, more preferably no greater than 10%, and most preferably no greater than 5% nitrogen (atomic %). $NbO_x$ and $BiO_x$ are crystalline for almost all composition ranges in the temperature regions of concern (e.g., tempering temperature at about 650 degrees C.). Similarly most stable solid solution phases of $NbBiO_x$ have been determined to be crystalline at 650 degrees C. However, crystalline $NbBiO_x$ layers are problematic because they are unstable upon HT such as thermal tempering. Conventional full oxidation sputter deposition techniques will result in crystalline layers. In order to keep the structure of NbBi or $NbBiO_x$ based layer 3 amorphous or substantially amorphous, the ionic radii difference of Nb and Bi may be used in sub-stoichiometric oxygen conditions. Using a oxygen depleted condition for deposition of NbBiOx, Nb (5+) can be forced into a lower co-ordination (4 co-ordination) with ionic radii~48 pm, while Bi (3+) in 6-co-ordination has ionic radii~103 pm, or Nb(5+) at 6-co-ordination with ionic radii~64 pm while Bi (3+) with 6-co-ordination has ionic radii~103 pm. The difference in cationic radii Nb and Bi causes lattice disorder caused by the oxygen gas depletion in the sputtering chamber(s) (e.g., more argon gas, and less oxygen gas) leading to amorphous or substantially amorphous structure for layer 3 which is stable even at high temperature tempering. Thus, a high index transparent dielectric layer of or including $NbBiO_x$, which is preferably suboxided (substoichiometric), is provided that is amorphous or substantially amorphous (as opposed to crystalline) as deposited, such as via sputtering, and is thus stable upon HT. The material property of layer 3 being heat stable in the sense that including the material into the low emissivity stack will not make it significantly change its performance towards non-functionality or significantly change in appearance upon optional HT. In certain example embodiments, a $NbBiO_x$ layer 3 may be sputter deposited using one or more ceramic target(s) of or including $NbBiO_x$.

| Material | n (@550 nm) | k (@400 nm) | Eg (cV) | Cation | Oxidation | Ionic Radii (pm) 4 Co-ordinated | Ionic Radii (pm) 6 Co-ordinated | $\Delta G_r$(KJ/mol) @298K |
|---|---|---|---|---|---|---|---|---|
| NbOx | ~2.2-24 | ~0.001-0.005 | ~3.4 | Nb | 3+ | | 72 | −711.3 |
| | | | | | 4+ | | 68 | −733.8 |
| | | | | | 5+ | 48 | 64 | −705.1 |
| BiOx | ~2.5-26 | ~0.01-0.05 | ~2.9 | Bi | 3+ | | 103 | −493 |
| | | | | | 5+ | | 76 | ?? |

The difference in atomic radii between Nb and Bi can be enhanced and adjusted by changing the oxidation states of both atoms by reducing oxygen content in the sputtering gas atmosphere used when sputter-depositing the layer 3, and this oxygen depletion in the sputtering atmosphere causes a lattice disorder (e.g., disruption in the lattice formation) and impedes the formation of crystals in the deposited layer, thereby leading to amorphous or substantially amorphous structure for sputter deposited layer(s) 3 which is stable even at high temperature thermal tempering. A large difference in ionic radii of Nb and Bi can disrupt the lattice and impede crystalline growth of the compound. The ionic radii depend on oxidation state and coordination number (e.g., see chart above). Lower oxygen conditions in the sputtering gaseous atmosphere force Nb into a lower co-coordination and lower coordination which in turn results in a larger difference in ionic radii between Nb and Bi. The table above shows that at 5+ oxidation states Nb and Bi have fairly close ionic radii of 64 and 76 pm, but when coordination shifts to 4 and/or the oxidation states change to 3+ upon oxygen depletion Nb and Bi have very different ionic radii as the Bi radii goes up to 103 pm, so as to impede crystalline growth. As a result, the layer 3 sputter-deposited in an oxygen depleted atmosphere is deposited in an amorphous or substantially amorphous state due to the large difference in ionic radii and lattice disruption and thus has thermal stability upon optional HT such as thermal tempering or heat bending.

Thus, high index layer 3 of or including $NbBiO_x$ may be sputter-deposited in an oxygen depleted atmosphere (an atmosphere including less oxygen gas than needed to form a fully stoichiometric oxide layer, including for example using no more than 60% of the oxygen needed to form a fully stoichiometric oxide layer, more preferably no more than 50% of the oxygen needed to form a fully stoichiometric oxide layer, and possibly no more than 30% of the oxygen needed to form a fully stoichiometric oxide layer) so that a difference in cationic radii for Nb and Bi causes lattice disorder leading to amorphous or substantially amorphous structure of the layer 3. If Nb (+5) and Bi (+5) are in 6 coordination during sputtering, any difference in ionic radii is small and there will be no lattice disruption and the layer 3 will be crystalline and thus unstable upon optional HT. However, if an oxygen depleted atmosphere, such as mostly Ar gas and a small amount of oxygen gas is used during sputter deposition of layer 3, then Nb will be forced to 4 co-ordination and Bi (3+) co-ordination will result in a large difference in ionic radii between Nb and Bi so as to cause deposition of an amorphous or substantially amorphous layer 3 which is more stable upon optional HT.

It has been found that providing more Nb than Bi in the $NbBiO_x$ inclusive high index layer 3 is beneficial. In certain example embodiments of this invention, metal content of the $NbBiO_x$ inclusive high index layer 3 is from 55-99% Nb, more preferably from 60-95% Nb, still more preferably from 70-90% Nb, and from 1-45% Bi, more preferably from 5-40% Bi, still more preferably from 10-30% Bi (atomic %). These metal contents have been found to improve durability and/or thermal stability. As explained above, these metals are preferably oxided to some extent, and may optional be slightly nitrided in certain example instances.

Silicon nitride inclusive transparent dielectric layers 2 and 5 are provided for antireflection purposes, and have been found to allow color shifts to be reduced. One or both of the silicon nitride layers 2 and/or 5 may be $Si_3N_4$. Alternatively, one or both of the silicon nitride layers 2 and/or 5 may be of the Si-rich type (not fully stoichiometric). Moreover, one or both of the silicon nitride layers 2 and/or 5 may further include a dopant such as aluminum or stainless steel, and/or small amounts of oxygen. These layers may be deposited via sputtering in certain example embodiments, or via any other suitable technique.

Transparent dielectric contact layer 7 is of or includes zinc oxide (e.g., ZnO). The zinc oxide of layer(s) 7 may contain other materials as well such as Al (e.g., to form $ZnAlO_x$) or Sn in certain example embodiments. For example, in certain example embodiments of this invention, zinc oxide layer 7 may be doped with from about 1 to 10% Al (or B), more preferably from about 1 to 5% Al (or B), and most preferably about 2 to 4% Al (or B). The use of zinc oxide 7 under the silver in layer 9 allows for an excellent quality of silver to be achieved. In certain example embodiments (e.g., to be discussed below) the zinc oxide inclusive layer 7 may be formed via sputtering a ceramic ZnO or metal rotatable magnetron sputtering target. It has been found that the use of the ceramic target in certain example embodiments (e.g., of ZnO, which may or may not be doped with Al, F or the like) allows for a high quality of silver to be provided thereby resulting in a lower emissivity coating. While the Zn:O in the ceramic target may be stoichiometric in certain example embodiments, at least one substoichiometric ceramic target comprising $ZnO_x$ (e.g., where $0.25 \leq x \leq 0.99$, more preferably $0.50 \leq x \leq 0.97$, and even more preferably $0.70 \leq x \leq 0.96$) may instead be used in sputter-depositing a zinc oxide inclusive layer 7 which may be substoichiometric in certain instances.

Infrared (IR) reflecting layer 9 is preferably substantially or entirely metallic and/or conductive, and may comprise or consist essentially of silver (Ag), gold, or any other suitable IR reflecting material. The silver of IR reflecting layer 9 may be doped with other material(s), such as with Pd, Zn, or Cu, in certain example embodiments. IR reflecting layer 9 helps allow the coating to have low-E and/or good solar control characteristics such as low emittance, low sheet resistance, and so forth. The IR reflecting layer may, however, be slightly oxidized in certain embodiments of this invention.

The upper contact layer 11 may be of or include an oxide of Ni and/or Cr. In certain example embodiments, upper contact layer 11 may be of or include nickel (Ni) oxide, chromium/chrome (Cr) oxide, or a nickel alloy oxide such as nickel chrome oxide ($NiCrO_x$), or other suitable material(s) such as $NiCrMoO_x$, $TiO_x$, metallic NiCr, or the like. The use of, for example, $NiCrO_x$ in this layer(s) 11 allows durability to be improved. The $NiCrO_x$ layer(s) 11, 11 may be fully oxidized in certain embodiments of this invention (i.e., fully stoichiometric), or alternatively may only be partially oxidized—substoichiometric (before and/or after optional HT). In certain instances, the $NiCrO_x$ layer 11 may be at least about 50% oxidized. Contact layer 11 (e.g., of or including an oxide of Ni and/or Cr) may or may not be oxidation graded in different embodiments of this invention. Oxidation grading means that the degree of oxidation in the layer changes through the thickness of the layer so that for example a contact layer may be graded so as to be less oxidized at the contact interface with the immediately adjacent IR reflecting layer 9 than at a portion of the contact layer further or more/most distant from the immediately adjacent IR reflecting layer. Descriptions of various types of oxidation graded contact layers are set forth in U.S. Pat. No. 6,576,349, the disclosure of which is hereby incorporated herein by reference. Contact layer 11 (e.g., of or including an oxide of Ni and/or Cr) may or may not be continuous in different embodiments of this invention across the entire IR reflecting layer 9.

In certain example embodiments, upper contact layer may be of high index material metallic or substantially metallic NbBi, or of or including $NbBiO_x$ which may be in suboxided form as discussed above so as to preferably be amorphous.

The overcoat is of or includes dielectric layers 13 and 15 in certain example embodiments. Optional transparent dielectric layer 13 may be of or include a metal oxide such as tin oxide in certain example embodiments of this invention. Metal oxide inclusive layer 13 is provided for antireflection purposes, and also improves the emissivity of the coated article and the stability and efficiency of the manufacturing process. The tin oxide layer 13 may be doped with other materials such as nitrogen and/or zinc in certain example embodiments of this invention. The tin oxide based layer 13 provides good durability and improves light transmission. Dielectric layer 15 may be of or include silicon nitride (e.g., $Si_3N_4$ or other suitable stoichiometry) or any other suitable material in certain example embodiments of this invention such as silicon oxynitride. Silicon nitride layer 15 may further include other material, such as aluminum as a dopant or small amounts of oxygen in certain example embodiments. Optionally, other layers, such as zirconium oxide, may be provided above layer 15 in the overcoat in certain example instances. Layer 15 is provided for durability purposes, and to protect the underlying layers. In certain example embodiments, silicon nitride based layer(s) 2, 5 and/or may have an index of refraction (n) of from about 1.8 to 2.2, more preferably from about 1.9 to 2.05. In certain example embodiments, Zr may be provided in the silicon nitride of layer 15 (or layer 2 or layer 5). Thus, one or more of layers 2, 5 and/or 15 may be of or include SiZrNx and/or zirconium oxide in certain example embodiments of this invention.

Other layer(s) below or above the illustrated FIG. 1 coating may also be provided. Thus, while the layer system or coating is "on" or "supported by" substrate 1 (directly or indirectly), other layer(s) may be provided therebetween. Thus, for example, the coating of FIG. 1 may be considered "on" and "supported by" the substrate 1 even if other layer(s) are provided between layer 2 and substrate 1. Moreover, certain layers of the illustrated coating may be removed in certain embodiments, while others may be added between the various layers or the various layer(s) may be split with other layer(s) added between the split sections in other embodiments of this invention without departing from the overall spirit of certain embodiments of this invention. For example and without limitation, silicon nitride layer 5 may be removed. As another example, silicon nitride layer 2 may be removed and layer 5 may be of tin oxide (e.g., $SnO_2$) instead of silicon nitride in certain alternative embodiments of this invention. As yet another example, layer 5 may be of tin oxide (e.g., $SnO_2$) instead of silicon nitride in still further alternative embodiments of this invention.

While various thicknesses may be used in different embodiments of this invention, example thicknesses and materials for the respective layers on the glass substrate 1 in the FIG. 1 embodiment may be as follows, from the glass substrate outwardly (e.g., the Al content in the zinc oxide layer and the silicon nitride layers may be from about 1-10%, more preferably from about 1-3% in certain example instances):

TABLE 1

(Example Materials/Thicknesses; FIG. 1 Embodiment)

| Layer | Preferred Range (Å) | More Preferred (Å) | Example (Å) |
|---|---|---|---|
| $Si_xN_y$ (layer 2) | 20-300 Å | 60-160 Å | 135 Å |
| $NbBiO_x$ (layer 3) | 30-200 Å | 40-120 Å | 95 Å |
| $Si_xN_y$ (layer 5) | 20-300 Å | 40-140 Å | 65 Å |
| $ZnAlO_x$ (layer 7) | 10-200 Å | 40-120 Å | 90 Å |
| Ag (layer 9) | 40-150 Å | 65-120 Å | 85 Å |
| $NiCrO_x$ (layer 11) | 10-70 Å | 20-50 Å | 30 Å |
| $SnO_2$ (layer 13) | 80-210 Å | 160-180 Å | 170 Å |
| $Si_xN_y$ (layer 15) | 100-250 Å | 160-180 Å | 170 Å |

In certain example embodiments of this invention, coated articles herein (e.g., see FIG. 1) may have the following low-E (low emissivity), solar and/or optical characteristics set forth in Table 2 when measured monolithically.

TABLE 2

| Low-E/Solar Characteristics (Monolithic) | | | |
|---|---|---|---|
| Characteristic | General | More Preferred | Most Preferred |
| $R_s$ (ohms/sq.): | <=11.0 | <=10 | <=9 |
| $E_n$: | <=0.2 | <=0.15 | <=0.11 |
| $T_{vis}$ (%): | >=50 | >=60 | >=70 |

While high index transparent dielectric layer 3 based on NbBi, or an oxide thereof, is shown and described in connection with the low-E coating of FIG. 1 above, this invention is not so limited. NbBi or $NbBiO_x$ based layer 3 as described above and herein may be used as a high index layer(s) in any suitable low-E coating either above or below an IR reflecting layer(s). One or more of such NbBi or $NbBiO_x$ based layers 3 may be provided in any suitable low-E coating. For example and without limitation, amorphous or substantially amorphous NbBi or $NbBiO_x$ based layer 3 as described above and herein may be used to replace any high index (e.g., $TiO_x$ or $TiO_2$) layer in any of the low-E coatings in any of U.S. Pat. Nos. 9,212,417, 9,297,197, 7,390,572, 7,153,579, 9,365,450, and 9,403,345, all of which are incorporated herein by reference.

In an example embodiment of this invention, there is provided a coated article including a coating supported by a glass substrate, the coating comprising: a first transparent dielectric layer on the glass substrate; an infrared (IR) reflecting layer comprising silver on the glass substrate, located over at least the first transparent dielectric layer; a second transparent dielectric layer on the glass substrate, located over at least the IR reflecting layer; and wherein at least one of the first and second transparent dielectric layers is amorphous or substantially amorphous, and comprises an oxide of Nb and Bi.

In the coated article of the immediately preceding paragraph, the at least one of the first and second transparent dielectric layers comprising the oxide of Nb and Bi may comprise a suboxide of Nb and Bi.

In the coated article of any of the preceding two paragraphs, the at least one of the first and second transparent dielectric layers comprising an oxide of Nb and Bi may have a refractive index (n) of at least 2.2, more preferably of at least 2.25.

In the coated article of any of the preceding three paragraphs, the first transparent dielectric layer may be amorphous or substantially amorphous, and comprise an oxide of Nb and Bi.

In the coated article of any of the preceding four paragraphs, the second transparent dielectric layer may be amorphous or substantially amorphous, and comprise an oxide of Nb and Bi.

In the coated article of any of the preceding five paragraphs, the coating may be a low-E coating and have a normal emissivity ($E_n$) of no greater than 0.2, more preferably no greater than 0.15, and most preferably no greater than 0.11.

In the coated article of any of the preceding six paragraphs, the coating may have a sheet resistance ($R_s$) of no greater than 11 ohms/square, more preferably no greater than 10 ohms/square, and most preferably no greater than 9 ohms/square.

In the coated article of any of the preceding seven paragraphs, the coating may comprise an overcoat including a layer comprising tin oxide and a layer comprising silicon nitride.

In the coated article of any of the preceding eight paragraphs, the coating may further comprise a layer comprising silicon nitride located between at least the glass substrate and the first transparent dielectric layer.

In the coated article of any of the preceding nine paragraphs, the coating may further comprise a layer comprising zinc oxide located under and directly contacting the IR reflecting layer.

In the coated article of any of the preceding ten paragraphs, the coating may further comprise a layer comprising an oxide of Ni and/or Cr located over and directly contacting the IR reflecting layer. This layer may be, for example, $NiCrO_x$ or $NiCrMoO_x$.

In the coated article of any of the preceding eleven paragraphs, the coated article may be thermally tempered.

In the coated article of any of the preceding twelve paragraphs, the coated article may have a visible transmission of at least 50%, more preferably of at least 60%, and most preferably of at least 70%.

In the coated article of any of the preceding thirteen paragraphs, metal content of the layer comprising the oxide of Nb and Bi may be from 55-99% Nb (more preferably from 60-95% Nb, still more preferably from 70-90% Nb), and from 1-45% Bi (more preferably from 5-40% Bi, still more preferably from 10-30% Bi) (atomic %).

In an example embodiment of this invention, there is provided a method of making a coated article including a coating supported by a glass substrate, the method comprising: sputter depositing a first transparent dielectric layer on the glass substrate; sputter-depositing an infrared (IR) reflecting layer comprising silver on the glass substrate, located over at least the first transparent dielectric layer; sputter-depositing a second transparent dielectric layer on the glass substrate, located over at least the IR reflecting layer; and wherein at least one of the first and second transparent dielectric layers is sputter-deposited so as to be amorphous or substantially amorphous, and comprise an oxide of Nb and Bi.

In the method of the immediately preceding paragraph, the at least one of the first and second transparent dielectric layers comprising an oxide of Nb and Bi may be sputter-deposited so as to comprise a suboxide of Nb and Bi.

In the method of any of the preceding two paragraphs, the at least one of the first and second transparent dielectric layers comprising an oxide of Nb and Bi may have a refractive index (n) of at least 2.2, more preferably of at least 2.5

In the method of any of the preceding three paragraphs, the at least one of the first and second transparent dielectric layers sputter-deposited so as to comprise an oxide of Nb and Bi may be sputter-deposited in an oxygen depleted atmosphere so that a difference in cationic radii for Nb and Bi causes lattice disorder leading to amorphous or substantially amorphous structure of the layer.

In the method of any of the preceding four paragraphs, the at least one of the first and second transparent dielectric layers sputter-deposited so as to comprise an oxide of Nb and Bi may be sputter-deposited using at least one ceramic target comprising Nb, Bi and O, and/or using at least one metallic target comprising Nb and Bi.

In the method of any of the preceding five paragraphs, the coating may be a low-E coating and have a normal emissivity ($E_n$) of no greater than 0.2, more preferably no greater than 0.15, and most preferably no greater than 0.11.

The method of any of the preceding six paragraphs may further comprise thermally tempering the glass substrate with the coating thereon.

In the method of any of the preceding seven paragraphs, the coated article may have a visible transmission of at least 50%, more preferably of at least 60%, and most preferably of at least 70%.

In the method of any of the preceding eight paragraphs, metal content of the layer comprising the oxide of Nb and Bi may be from 55-99% Nb (more preferably from 60-95% Nb, still more preferably from 70-90% Nb), and from 1-45% Bi (more preferably from 5-40% Bi, still more preferably from 10-30% Bi) (atomic %).

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:
1. A coated article including a coating supported by a glass substrate, the coating comprising:
   a first transparent dielectric layer on the glass substrate;
   an infrared (IR) reflecting layer comprising silver on the glass substrate, located over at least the first transparent dielectric layer;
   a second transparent dielectric layer on the glass substrate, located over at least the IR reflecting layer; and
   wherein at least one of the first and second transparent dielectric layers is amorphous or substantially amorphous, and comprises an oxide of Nb and Bi wherein the metal content of the oxide of Nb and Bi is from 55-99% Nb and from 1-45% Bi (atomic %).

2. The coated article of claim 1, wherein the at least one of the first and second transparent dielectric layers comprising an oxide of Nb and Bi comprises a suboxide of Nb and Bi.

3. The coated article of claim 1, wherein the at least one of the first and second transparent dielectric layers comprising an oxide of Nb and Bi has a refractive index (n) of at least 2.2.

4. The coated article of claim 1, wherein the at least one of the first and second transparent dielectric layers comprising an oxide of Nb and Bi has a refractive index (n) of at least 2.25.

5. The coated article of claim 1, wherein the first transparent dielectric layers is amorphous or substantially amorphous, and comprises the oxide of Nb and Bi.

6. The coated article of claim 1, wherein the second transparent dielectric layers is amorphous or substantially amorphous, and comprises the oxide of Nb and Bi.

7. The coated article of claim 1, wherein the coating is a low-E coating and has a normal emissivity ($E_n$) of no greater than 0.2.

8. The coated article of claim 1, wherein the coating has a sheet resistance ($R_s$) of no greater than 9 ohms/square.

9. The coated article of claim 1, wherein the coating comprises an overcoat including a layer comprising tin oxide and a layer comprising silicon nitride.

10. The coated article of claim 1, wherein the coating further comprises a layer comprising silicon nitride located between at least the glass substrate and the first transparent dielectric layer.

11. The coated article of claim 1, wherein the coating further comprises a layer comprising zinc oxide located under and directly contacting the IR reflecting layer.

12. The coated article of claim 1, wherein the coating further comprises a layer comprising an oxide of Ni and/or Cr located over and directly contacting the IR reflecting layer.

13. The coated article of claim 1, wherein the coated article is thermally tempered.

14. The coated article of claim 1, wherein the coated article has a visible transmission of at least 50%.

15. The coated article of claim 1, wherein metal content of the at least one of the first and second transparent dielectric layers comprising an oxide of Nb and Bi is from 60-95% Nb and from 5-40% Bi (atomic %).

16. The coated article of claim 1, wherein metal content of the at least one of the first and second transparent dielectric layers comprising an oxide of Nb and Bi is from 70-90% Nb and from 10-30% Bi (atomic %).

17. A method of making a coated article including a coating supported by a glass substrate, the method comprising:

sputter depositing a first transparent dielectric layer on the glass substrate;

sputter-depositing an infrared (IR) reflecting layer comprising silver on the glass substrate, located over at least the first transparent dielectric layer;

sputter-depositing a second transparent dielectric layer on the glass substrate, located over at least the IR reflecting layer; and wherein at least one of the first and second transparent dielectric layers is sputter-deposited so as to be amorphous or substantially amorphous, and comprise an oxide of Nb and Bi wherein the metal content of the oxide of Nb and Bi is from 55-99% Nb and from 1-45% Bi (atomic %).

18. The method of claim 17, wherein the at least one of the first and second transparent dielectric layers comprising an oxide of Nb and Bi is sputter-deposited so as to comprise a suboxide of Nb and Bi.

19. The method of claim 17, wherein the at least one of the first and second transparent dielectric layers comprising an oxide of Nb and Bi has a refractive index (n) of at least 2.2.

20. The method of claim 17, wherein the at least one of the first and second transparent dielectric layers sputter-deposited so as to be amorphous and comprise and oxide of Nb and Bi is sputter-deposited in an oxygen depleted atmosphere so that a difference in cationic radii for Nb and Bi causes lattice disorder leading to amorphous or substantially amorphous structure of the layer.

21. The method of claim 17, wherein the at least one of the first and second transparent dielectric layers sputter-deposited so as to comprise an oxide of Nb and Bi is sputter-deposited using at least one ceramic target comprising Nb, Bi and O.

22. The method of claim 17, wherein the at least one of the first and second transparent dielectric layers sputter-deposited so as to comprise an oxide of Nb and Bi is sputter-deposited using at least one metallic target comprising Nb and Bi.

23. The method of claim 17, wherein the coating is a low-E coating and has a normal emissivity ($E_n$) of no greater than 0.2.

24. The method of claim 17, further comprising thermally tempering the glass substrate with the coating thereon.

25. The method of claim 17, wherein the coated article has a visible transmission of at least 50%.

* * * * *